United States Patent
Schuh et al.

(10) Patent No.: US 7,024,737 B2
(45) Date of Patent: Apr. 11, 2006

(54) METHOD FOR PRODUCING AN ELECTRONIC OR ELECTRICAL COMPONENT WITH A PLASTIC-PASSIVATED SURFACE

(75) Inventors: Carsten Schuh, Baldham (DE); Wilhelm Hekele, Eggstaett (DE)

(73) Assignee: Siemens Aktiengesellschaft, Munich (DE)

( * ) Notice: Subject to any disclaimer, the term of this patent is extended or adjusted under 35 U.S.C. 154(b) by 324 days.

(21) Appl. No.: 10/003,756

(22) Filed: Nov. 1, 2001

(65) Prior Publication Data

US 2002/0038713 A1  Apr. 4, 2002

Related U.S. Application Data

(62) Division of application No. 09/295,917, filed on Apr. 21, 1999, now abandoned.

(30) Foreign Application Priority Data

Apr. 22, 1998 (DE) .............................. 198 18 036

(51) Int. Cl.
*H04R 17/00* (2006.01)

(52) U.S. Cl. .................. 29/25.35; 29/25.42; 29/832; 29/841; 310/328; 310/346; 427/100

(58) Field of Classification Search .............. 29/841, 29/853, 25.35, 25.42, 832, 854; 174/52.2–52.5, 174/50.5, 50.54; 361/728, 746; 257/687, 257/729; 156/303.1, 308.2; 264/236; 310/328, 310/346; 427/100
See application file for complete search history.

(56) References Cited

U.S. PATENT DOCUMENTS

| 4,314,302 | A | * | 2/1982 | Baumbach ................... 361/119 |
| 4,553,059 | A | | 11/1985 | Abe et al. |
| 4,670,771 | A | | 6/1987 | Neidig et al. .................. 357/74 |
| 4,681,985 | A | * | 7/1987 | Katz et al. .................. 174/73.1 |
| 4,774,154 | A | | 9/1988 | Singelyn et al. |
| 4,803,393 | A | | 2/1989 | Takahashi |
| RE33,137 | E | * | 12/1989 | Gurevich et al. ............. 337/255 |
| 5,148,077 | A | | 9/1992 | Grawey et al. .............. 310/328 |
| 5,218,259 | A | | 6/1993 | Dam et al. ................... 310/328 |
| 5,233,260 | A | | 8/1993 | Harada et al. ............... 310/328 |
| 5,247,277 | A | * | 9/1993 | Fang et al. ................ 338/22 R |
| 5,407,759 | A | | 4/1995 | Ohsuga ......................... 429/35 |
| 5,438,232 | A | | 8/1995 | Inoue et al. |
| 5,439,031 | A | * | 8/1995 | Steele et al. ................. 264/515 |
| 5,753,537 | A | | 5/1998 | Dekker et al. .............. 438/113 |
| 5,861,577 | A | * | 1/1999 | Tamura et al. ........... 174/50.56 |
| 6,008,975 | A | * | 12/1999 | Kester et al. ................ 361/117 |

FOREIGN PATENT DOCUMENTS

| DE | 1 902 392 | 1/1969 |
| DE | 43 10 401 | 3/1993 |
| EP | 0 720 182 A2 | 7/1996 |
| JP | 58 112269 | 4/1983 |
| WO | WO 92/06532 | 11/1990 |

* cited by examiner

*Primary Examiner*—Minh Trinh
*Assistant Examiner*—Donghai D. Nguyen
(74) *Attorney, Agent, or Firm*—Schiff Hardin LLP

(57) ABSTRACT

A simple method for passivation of a component is presented which is particularly suitable for processing high-viscosity plastics. The component is arranged in a preproduced plastic body and is connected to the body. This method is proposed for the production of a piezoactuator arrangement, which is utilized for controlling injection valves in internal-combustion engines. The plastic consists of solid silicone and/or fluorinated silicone elastomer.

16 Claims, 3 Drawing Sheets

METHOD FOR PRODUCING AN ELECTRONIC OR ELECTRICAL COMPONENT WITH A PLASTIC-PASSIVATED SURFACE

CROSS-REFERENCE TO RELATED APPLICATIONS

The present application is a division of U.S. Ser. No. 09/295,917, now abandoned, filed Apr. 21, 1999.

FIELD OF THE INVENTION

The present invention relates generally to methods for producing an electrical or electronic (i.e. "electrotechnical") component which includes a surface to be passivated with a plastic coating. More specifically, the present invention relates to a method for producing such a component that comprises the steps of providing a plastic body for accommodating and encapsulating the surface of the component, inserting the component into the plastic body and joining the surface of the component to the plastic body by applying pressure to the plastic body.

BACKGROUND OF THE INVENTION

It is often necessary to passivate sensitive electronic components such as piezoactuators in order to insulate their surfaces electrically and to protect their surfaces from contamination or mechanical damage. This is achieved among other ways in that the component is provided with a protective housing made of plastic. The plastic is deposited on the structural element absent cross-linking. The actual protective layer is built by the polymerization or vulcanization of the plastic. The deposition of the non-cross-linked plastic occurs by immersion, by spraying or in the injection molding process. For these techniques to be possible, the utilized plastics must have a sufficiently low viscosity.

According to the requirements placed on the protective layer of the component, more viscous plastics must be processed in certain circumstances. For example, the reliability of piezoactuators which are employed in diesel injection systems depends decisively on the elasticity of the protective housing, which must be guaranteed between −50° C. and +150° C. This specification is satisfied by silicone elastomers. In the non-vulcanized state, these elastomers are relatively highly viscous and are thus only conditionally suited to automation.

The continuous passivation of such piezoactuators is achieved in the current state of the art in that the silicone elastomer is deposited on the actuator by hand with a brush or pencil. The plastic is subsequently cross-linked by increasing the temperature.

With respect to the application of piezoactuators in diesel injection systems, which requires a centering of the actuator in a cylindrical shape, for example, it is necessary to additionally encapsulate the passivated actuator with its electrical terminals. To this end, the actuator is placed in a hollow profile. The encapsulating likewise occurs by hand. Subsequent to the processing of the plastic, the hollow profile, which consists of a thermoplastic material, for example, is a component of the protective housing of the actuator.

Alternatively, the actuator can be passivated and encapsulated at the same time in the injection molding process by using a hollow profile. The actuator is therein arranged in the hollow profile, and the plastic is injected under pressure into the interspace between actuator and casing. If highly viscous plastics such as silicone are processed in this type of method, then a higher injection pressure must be applied.

WO 92/06532 teaches an encapsulated piezoactuator and a method for its production. The protective housing there consists of an elastomer layer, or respectively, a silicone-elastomer layer. The unvulcanized plastic is attached at the actuator in a method similar to injection molding. The actuator is therein placed in a casing. The elastomer is inserted between the outer wall of the actuator and the inner wall of the casing by means of a vacuum. After the cross-linking of the elastomer, the casing is removed.

In contrast to the hand processing, the described injection molding method is capable of being automated. However, due to the high shear speeds with which the plastic must be processed, the danger exists of the actuator being pressed against the wall of the hollow profile. The centering of the actuator can only be guaranteed by a considerable technical outlay. There is also the danger that the surface of the actuator is passivated incompletely. These problems are a burden particularly for piezoactuators, since piezoactuators can comprise length tolerances of up to ±3%, conditional to production.

Mainly LSR (Liquid Silicone Rubber) silicones are utilized in current injection molding methods. These materials have the disadvantage that they are not self-adherent or pressure-sensitive. This means that the surface of the actuator must be treated or primed prior to the actual injection molding. In this step of the method, among other substances, a substance which improves, or respectively, enables the chemical adhesion of the plastic housing on the actuator is deposited on the surface of said actuator. If, on the other hand, self-adherent plastics are used, the injection molding tool must be provided with an anti-adhesion material. The lifetimes of the tools and the reliability of the process are thereby appreciably reduced.

Furthermore, the silicone elastomers that are appropriate for current shaping methods such as injection molding demonstrate a low resistance to swelling compared to diesel or raps-methyl-ester (fuel substitute for diesel). This is a problem particularly when a piezoactuator is used in diesel injection systems and must be removed from the injector housing of this system after a certain number of operating hours.

The expansion temperature coefficient of silicones is strongly positive; by contrast, that of piezoceramics can become negative in the poled state. Therefore, care must be taken that there are no temperature fluctuations until such time as the adhesion between the protective silicone casing and the piezoceramic is sufficient. A rapid building of adhesion is therefore desirable. At the same time, the stability requirement for the production process is very high.

Therefore, there is a need for a simple method for passivating the surface of an electrotechnical component.

SUMMARY OF THE INVENTION

The aforenoted need is satisfied by the present invention which provides a preproduced body consisting of plastic, the surface of the component which is to be passivated is united with the body, and these are made to contact one another by an exertion of pressure. This method is particularly suited to the production of highly viscous plastics. It is particularly advantageous to apply the method to the passivation of electrotechnical components which consist of ceramic, such as fuel cells and piezoactuators.

One electrotechnical (or electrical or electronic) component with a passivated surface is, for instance, a piezoactuator arrangement consisting of a monolithic piezoactuator in a multilayer construction and a plastic body which surrounds this actuator. The plastic body and the actuator are fixedly connected. The surface of the actuator and the inner surface of the body are shaped inversely to one another, at least in regions. i.e., there is an intimate, direct contact between actuator and body here. The plastic body consists of solid silicone or silicone elastomers, or of other plastics.

The idea on which the production method for this type of piezoactuator arrangement is based consists in the attachment of the actuator in a preproduced plastic body and the subsequent connection of said actuator to the plastic of the body. A piece of longer tubing can be used as a plastic body, for example, into which piece the component is placed prior to the connection.

The body can also have a complicated construction. The inner surface of the plastic body into which the actuator is arranged during the production process at least partially comprises the inverse shape of the surface of the actuator. The surface of the actuator derives from the actuator itself and all the electrical components which are to be passivated along with it (e.g. contact lugs or electrical terminals).

The production of the contact between the actuator and the body occurs in that the inner wall of the body is pressed against the outer wall of the piezoactuator. A tube consists of vulcanized plastic, for example, and can be shrunk onto the actuator by raising the temperature, for example. It is particularly advantageous if the body consists of material which is cross-linked only partially, if at all, and which is sufficiently free-flowing and at the same time has sufficient dimensional stability. If, for example, the cross-linking of the plastic, which is commenced following the insertion of the component into the body, occurs in conjunction with a volume enlargement, the plastic automatically flows in the cross-linking into all the hollow spaces which are located between the component and the plastic body. What is known as an inner pressure is generated.

If a device is used which exerts a pressure on the body, which pressure is directed onto the surface of the actuator from the outside, then the interspaces between the actuator and the body are filled with material with the aid of the fluidity of the plastic. The device used here is a press tool, for example. During the compression process, the free-flowing plastic functions as the medium of pressure transmission. This means that the same pressure prevails everywhere in the plastic at any given time of the compression process. In the basis of this quasi-isostatic application of pressure, the uniform encapsulating and the self-centering of the actuator are possible in a simple fashion. The cross-linking of the plastic occurs after or during the compression process in a conventional manner; for example, by raising the temperature or by exposure.

For certain specifications, pressure alone does not suffice to produce contact. As with piezoactuator arrangements that are employed in diesel injection systems, a continuous, pore-free passivation must be guaranteed in order to suppress the penetration of water or diesel. This is only achieved when chemical bonds are formed between actuator and plastic casing (e.g. Van der Waals or hydrogen bonds). To this end, according to conventional methods, an adhesion agent (primer) must be deposited on the surface of the actuator or the plastic body. Alternatively, what is known as an internal adhesion agent can be mixed into the plastic during the molding process of the body, whereby the adhesion agent is automatically present on the surface of the body. Primers have hydrophilic terminal groups, for example, which interact with the ceramic surface of the actuator, and hydrophobic terminal groups, which form bonds to the plastic. With the aid of the primer, the cross-linking of the plastic leads to a continuous contact between the plastic body and the actuator. It is particularly advantageous if an internal adhesion agent is used. This achieves a faster buildup of adhesion during the production process. In this case, the expensive priming of the piezoactuator can be forgone.

It has proven advantageous if the device in which the plastic body for producing the contact between body and actuator is located has at least one drain opening for excess plastic material. Together with the fluidity of the plastic, possible length tolerances of the actuator can be easily compensated.

The plastic body itself is produced in a molding process such as injection molding. After the molding process, the body has a sufficiently high dimensional stability and at the same time sufficient fluidity. This is achieved in that stabilizing elements are added to the plastic, for example. Plastic fillers in the form of globules are appropriate stabilizing elements, for example. It is also possible for the plastic body to be embedded in a housing, which consists of a thermoplastic plastic or is produced from another material such as metal, for example.

A specific dimensional stability of the plastic body can be achieved particularly by the purposeful cross-linking of the plastic. Few cross-link points are generated therein. The speed of a cross-linking reaction can be influenced by altering the reaction temperature, for example. If a corresponding temperature program runs in the production process of the plastic body, the cross-linking reaction can be aborted upon the attainment of a specific degree of cross-linking.

A defined degree of cross-linking can also be attained, for example, in that the raw compound for producing the plastic body contains a substance for starting the cross-linking, in a specific concentration. The concentration of this substance is selected such that a desired number of cross-links are generated in the cross-linking.

A combination of substances which facilitate the cross-linking and those which prevent the cross-linking is also imaginable.

For dimensional stabilization, the partially cross-linked plastics can also contain additional stabilizing elements.

In the cooperation of the production of the plastic body and the passivation of the piezoactuator, the cross-linking of the plastic is interrupted or at least decelerated subsequent to the molding process (e.g. see above) and is recommenced subsequent to the embedding of the actuator into the body. This occurs in that a temperature program is executed, for example. In the simplest case, the plastic contains a substance on the basis of which, at a specific temperature or in a specific temperature range, the cross-liking reaction of the plastic proceeds with optimal speed. If the temperature deviates from the optimal conditions, the reaction rate of the cross-linking decelerates. It is also imaginable that the plastic raw compound contains at least two substances, which enable the cross-linking of the plastic under different conditions (e.g. temperatures), respectively. The concentration of one substance is selected such that a specific degree of cross-linking is created in the molding process of the plastic body. The concentration of a second substance makes possible the required degree of cross-linking in the passivation process of the actuator.

It is also possible for the two substances to be put into a reactive state by exposure at different wavelengths. Different light sources can be used here. Selected filter systems for electromagnetic radiation produce the same effect. A combination of exposure and a temperature program is also possible.

Subsequent to the molding process, the plastic body can be constructed of at least two individual parts, which yield the actual plastic body when joined. For example, the body consists of two half-shells in which the components can be placed easily. In the passivation process, the two half-shells are joined into a single fixedly connected protective casing. Given the utilization of multipartite plastic bodies, electrotechnical components of complicated construction can also be passivated easily and gently.

It has proven particularly advantageous if the same device is used for the molding of the plastic body and for the passivation of the component. The process conditions for the production of a piezoactuator arrangement can thereby be optimally adapted to the cooperation of the molding of the plastic body with the passivation of the surface of the component.

Besides the advantages described above, the following should be noted with respect to the invention. Specifically, the automation of the continuous passivation and of the encapsulating of an electronic or electrical component is easily possible. By separating the production of the plastic body and the passivation of the component, it is possible to preproduce the body cost-effectively; for example, in an injection molding process. It is possible to tailor the plastic ductility and the dimensional stability of the plastic, as well as the buildup of plastic component, to the processing process, and so to optimize them. The tools that are necessary for the processing (e.g. injection molding for producing the plastic body and a compression process in the passivation of the component) are relatively easy to realize. Arbitrary plastics can be employed. The described method is cost-effective.

In an embodiment, the present invention provides a method for producing an electrical or electronic component which comprises a surface that is passivated with a plastic coating, the method comprising of providing a plastic body for accommodating and encapsulating the surface of the component, inserting the component into the plastic body, joining the surface of the component to the plastic body by applying pressure to the plastic body.

In an embodiment, the body is molded.

In an embodiment, the body is tubular in configuration.

In an embodiment, the body comprises an inside surface that is inverse in form to the surface of the component to be passivated.

In an embodiment, the body comprises at least two individual parts which are connected to the surface of the component.

In an embodiment, the body comprises at least partially cross-linked plastic.

In an embodiment, the body comprises at least one stabilizing element.

In an embodiment, the body comprises a substance for mediating adhesion.

In an embodiment, the surface of the component comprises a substance for mediating adhesion.

In an embodiment, the body comprises at least one plastic that is selected from the group consisting of solid silicones and fluorinated silicone elastomers.

In an embodiment, the step of joining the surface of the component to the body further comprises applying pressure from outside the body towards the component by with a device for generating pressure.

In an embodiment, the pressure is generated by the cross-liking of the plastic of the body.

In an embodiment, the plastic is cross-linked thermally.

In an embodiment, the plastic is cross-linked by exposure.

In an embodiment, the present invention provides an electrical component that comprises a surface passivated with a plastic material of a plastic body, the plastic comprising at least one substance selected from the group consisting of solid silicones and fluorinated silicone elastomers.

In an embodiment, the body comprises an inner surface in contact with the surface of the component, the inner surface of the body and the surface of the component being in continuous contact with one another.

In an embodiment, the component is a piezoelectric element.

In an embodiment, the piezoelectric element is a piezoactuator.

In an embodiment, the component is a fuel cell.

In an embodiment, the present invention provides a method for controlling an injection valve of an internal-combustion engine comprising the use of the piezoactuator described above.

Other objects and advantages of the invention will become apparent upon reading the following detailed description and appended claims, and upon reference to the accompanying drawings.

BRIEF DESCRIPTION OF THE DRAWINGS

The invention is exemplarily detailed below with the aid of a piezoactuator arrangement and the associated figures. The figures are not drawn to scale.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

DETAILED DESCRIPTION OF THE PRESENTLY PREFERRED EMBODIMENTS

Figure 1:
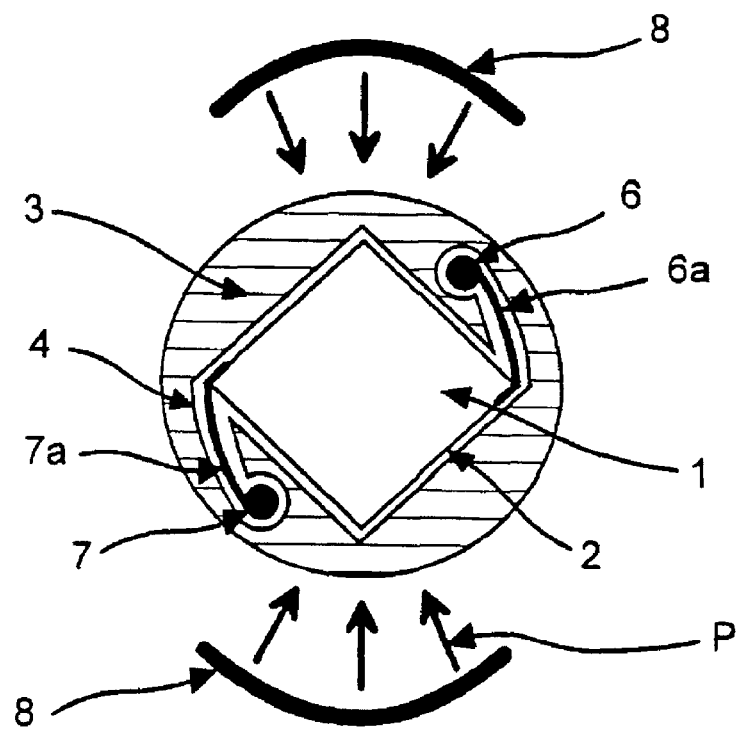
FIG. 1 is a cross-section of a piezoactuator that is arranged in a plastic body. The tool which is used to generate the pressure is schematically depicted.
Figure 2:
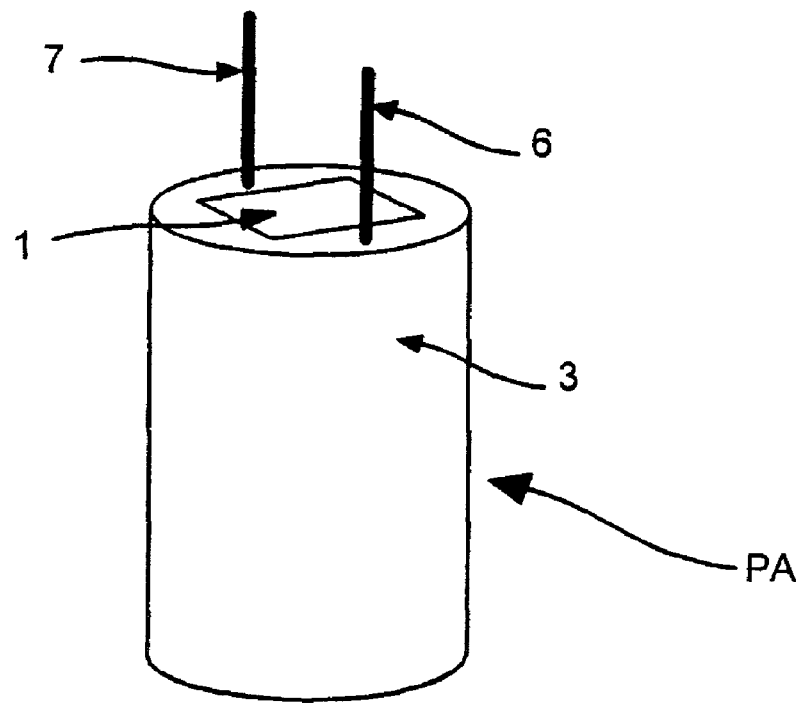
FIG. 2 is a perspective view of the piezoactuator arrangement shown in FIG. 1.
Figure 3:
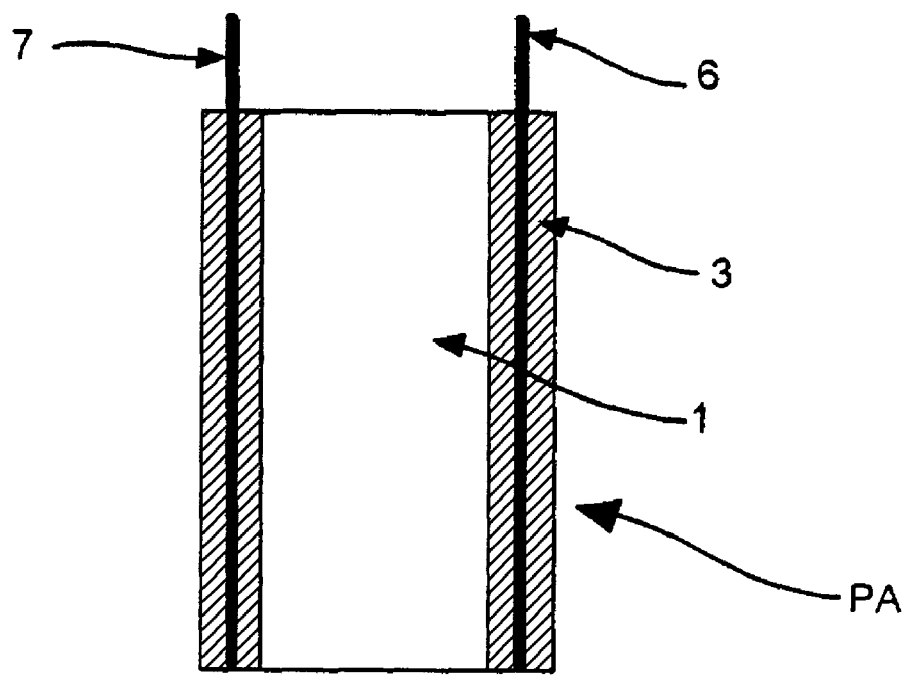
FIG. 3 is a longitudinal sectional view of the piezoactuator arrangement shown in FIG. 1.
Figure 4:
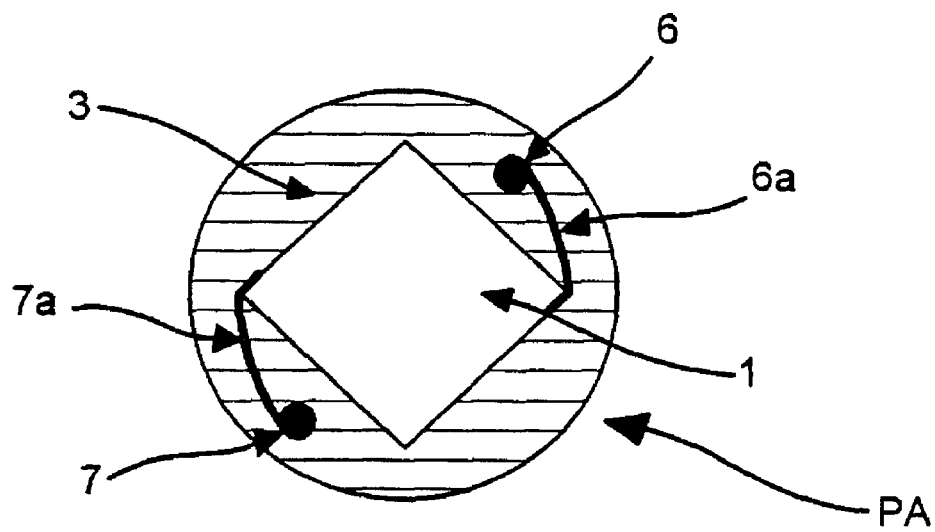
FIG. 4 is a sectional view of the piezoactuator arrangement shown in FIG. 1.

The piezoactuator arrangement PA (see FIG. 2) consists of a piezoactuator 1, which is connected via contact lugs 6a and 7a and to electrical terminals 6 and 7, as well as a plastic body 3 (see FIG. 1).

The piezoactuator arrangement PA is produced in two subprocesses. In a first step, the plastic body 3 is preproduced in a molding process. In the second step, the passivation and simultaneous encapsulation of the piezoactuator with its electrical terminals occur. The same device is used in the preproduction of the plastic body and the passivation of the actuator.

Figure 5:
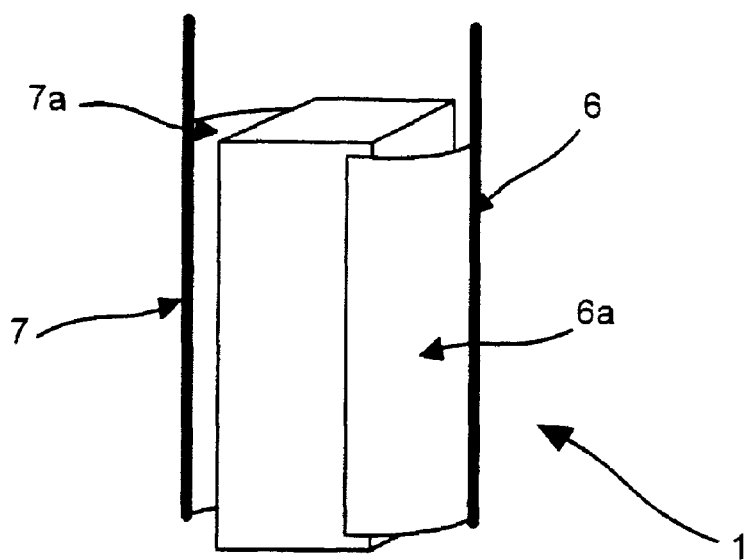
FIG. 5 is a perspective view of the piezoactuator which is provided with contact lugs and electrical terminals.
Figure 6:
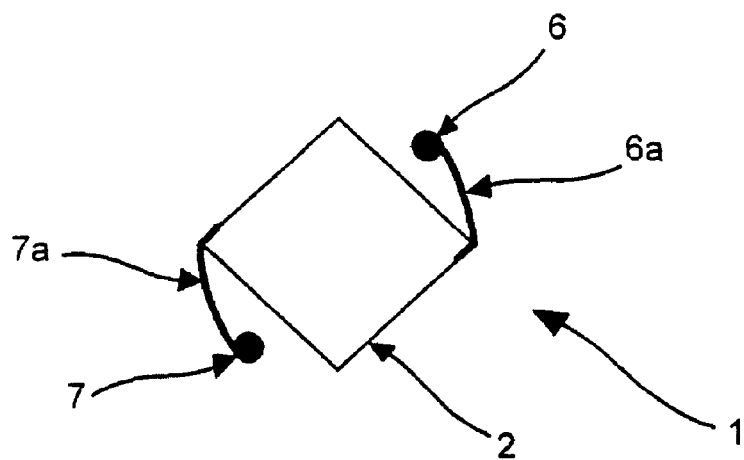
FIG. 6 is a sectional view of the piezoactuator shown in FIG. 5.
Figure 7:
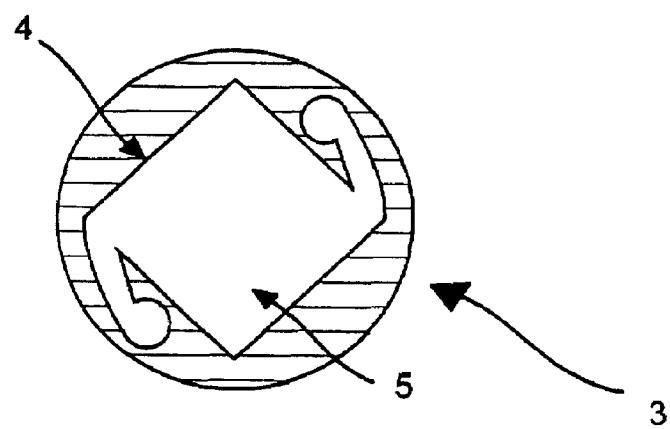
FIG. 7 is a sectional view of a plastic body for the piezoactuator of FIG. 5.

The plastic body 3 is produced in an injection molding process, for example. As another essential feature, besides a drain opening for excess plastic material, the device used comprises the shape of the surface 2 of the actuator 1. A plastic body 3 with a hollow space 5 (see FIG. 7) is thereby obtained in the molding process, the inner surface 4 of which comprises the surface 2 of the actuator 1, in inverse form. The FIGS. 5 and 6 schematically depict a piezoactuator 1 with a surface 2. A correspondingly shaped plastic body 3 with a hollow space 5 and an inner surface 4 can be seen in cross-section in FIG. 7.

As starting material, solid silicone or fluorinated silicone elastomer are used. The compound contains cross-linking substances such as sulfurous compounds. Furthermore, an internal adhesion agent is added to the mixture in the form of a silicone organic compound with hydrophilic and hydrophobic side-groups at its disposal. Subsequent to the filling of the injection mold with the starting mixture, the cross-linking of the plastic is commenced, e.g. by raising the temperature. When a degree of cross-linking has been attained which leads to a dimensionally stable but still free-flowing state of the plastic body, the cross-linking of the plastic is decelerated, or respectively, discontinued by lowering the temperature.

The mold of the injection molding tool that corresponds to the piezoactuator is removed from the preproduced plastic body, and in its place, the piezoactuator itself is inserted into the now present hollow space 5 of the body 3. FIG. 1 depicts a piezoactuator 1 which has been inserted into a preproduced plastic body 3.

Subsequent to the insertion of the piezoactuator, the encapsulating and the passivation of the piezoactuator occur. To this end, the injection molding tool is used as a compression tool. By means of the compression tool 8, the pressure P is exerted on the plastic body from the outside in the direction of the surface of the piezoactuator. The compression tool and the pressure P exerted thereby are schematically depicted in FIG. 1.

The cross-linking of the plastic is recommenced. The interspaces between piezoactuator and plastic body are filled so as to be free of pores. Excess plastic material can drain through the opening of the utilized device. The contact between the piezoactuator and the plastic body is produced with the aid of the adhesion agent.

The piezoactuator arrangement so produced is employed for controlling an injection valve of an internal-combustion engine, particularly of a diesel motor.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

We claim:

1. A method for producing an electrical or electronic component which comprises an outer surface that is passivated with a plastic coating, the method comprising the steps of:

providing a body of plastic material comprising at least partially cross-linked plastic for accommodating and encapsulating a portion of the outer surface of the component, said body being a hollow body having an inside surface that is inverse in form to the outer surface of the component and an outer surface;

inserting the component into the body; then joining the surface of the component to the body by applying pressure to the outer surface of the body of plastic material; and cross-link the plastic during or after the applying of the pressure; wherein;

applying pressure utilizes a quasi-isostatic application of pressure that causes the plastic to free-flow and serve as a medium of uniform pressure transmission.

2. The method of claim 1 wherein the body is molded.

3. The method of claim 1 wherein the body is tubular in configuration.

4. The method of claim 1 wherein the step of providing the body provides a body with at least two individual parts which are connected to the surface of the component during the step of joining.

5. The method of claim 1 wherein the plastic material of the body comprises at least one stabilizing element.

6. The method of claim 1 wherein the material of the body comprises a substance for mediating adhesion.

7. The method of claim 1 wherein the step of inserting the component includes inserting the component with the outer surface with a substance for mediating adhesion.

8. The method of claim 1 wherein the plastic material of the body comprises at least one plastic that is selected from the group consisting of solid silicones and fluorinated silicone elastomers.

9. The method according to claim 1, wherein the outer surface of the component has at least one contact lug connected to an electrical terminal, and the step of joining the surface of the component to the body joins the inside surface of the body to the contact lug, a portion of the terminal and the outer surface of the component.

10. The method according to claim 1, further comprising: providing at least one drain opening for excess plastic material in a device in which the plastic body for producing a contact between the body and actuator is located.

11. The method according to claim 1, further comprising: mixing an internal adhesion agent during a molding process of the body such that the adhesion agent is automatically present on the surface of the body.

12. A method for producing an electrical or electronic component having an outer surface passivated by a plastic coating, the method comprising the steps of:

providing a component with the outer surface;

molding a plastic material comprising at least partially cross-linked plastic to form a tubular body having an outside surface and a hollow space with an inside surface that is inverse in form to the outer surface of the component;

inserting the component into the hollow space of the tubular the body; then applying pressure to an outer surface of the body to join the inside surface of the hollow space to the outer surface of the component to secure the plastic coating on the outer surface of the component; and cross-link the plastic during or after the applying of the pressure; wherein applying pressure utilizes a guasi-isostatic application of pressure that causes the plastic to free-flow and serve as a medium of uniform pressure transmission.

13. The method according to claim 12 wherein the step of applying pressure presses a device on the outside surface of the body to create the pressure to join the inside surface of the hollow space on the outer surface of the component.

14. The method according to claim 13 wherein the step of molding includes providing a plastic material including a cross-linking substance and partially cross-linking the body during the molding, and while pressing the device during applying pressure, recommencing the cross-linking of the body.

15. The method according to claim 12, wherein the outer surface of the component has contact lugs connected to electrical terminals and the step of applying pressure secures the plastic coating on the outer surface of the contact lugs and portions of the terminals of the component in addition to the outer surface of the component.

16. A method for producing an electrical or electronic component which comprises an outer surface that is passivated with a plastic coating, said outer surface having at least one contact lug connected to an electrical terminal, the method comprising the steps of:

providing a body of plastic material comprising at least partially cross-linked plastic for accommodating and encapsulating a portion of the outer surface of the component, said body being a hollow body having an inside surface that is inverse in form to the outer surface of the component, the contact lug and terminal;

inserting the component into the body;

joining the surface of the component to the body by applying pressure to an outer surface of the body of plastic material to pressure the inside surface of the body on the contact lug, a portion of the terminal and the outer surface of the component;

wherein applying pressure utilizes a guasi-isostatic application of pressure that causes the plastic to free-flow and serve as a medium of uniform pressure transmission:

the method further comprising:

cross-linking the plastic during or after the applying of the pressure.

* * * * *